United States Patent [19]
Keeth

[11] Patent Number: 6,057,718
[45] Date of Patent: *May 2, 2000

[54] METHOD AND APPARATUS FOR A CHARGE CONSERVING DRIVER CIRCUIT FOR CAPACITIVE LOADS

[75] Inventor: Brent Keeth, Boise, Id.

[73] Assignee: Micron Technology, Inc., Boise, Id.

[ * ] Notice: This patent is subject to a terminal disclaimer.

[21] Appl. No.: 09/086,017

[22] Filed: May 28, 1998

Related U.S. Application Data

[63] Continuation of application No. 08/806,826, Feb. 26, 1997, Pat. No. 5,760,621.

[51] Int. Cl.[7] .................................................. H03K 17/687
[52] U.S. Cl. ............................................ 327/112; 327/333
[58] Field of Search ..................................... 327/108, 111, 327/112, 333, 427, 525, 545, 546, 313, 403, 404, 407, 408, 409, 389; 326/83, 87, 38, 39

[56] References Cited

U.S. PATENT DOCUMENTS

| | | | |
|---|---|---|---|
| 3,675,043 | 7/1972 | Bell ............................................. | 326/70 |
| 4,121,203 | 10/1978 | Edwards et al. ......................... | 327/333 |
| 4,731,553 | 3/1988 | Van Lehn et al. ........................ | 326/27 |
| 4,733,105 | 3/1988 | Shin et al. ................................ | 327/333 |
| 4,963,766 | 10/1990 | Lundberg .................................. | 326/58 |
| 5,047,660 | 9/1991 | Kannegundla et al. ................. | 327/111 |
| 5,124,585 | 6/1992 | Kim et al. ................................. | 326/87 |
| 5,128,560 | 7/1992 | Chern et al. .............................. | 326/81 |
| 5,136,191 | 8/1992 | Nunogami ................................. | 326/81 |
| 5,144,165 | 9/1992 | Dhong et al. ............................. | 326/80 |
| 5,350,951 | 9/1994 | Adachi ..................................... | 327/389 |
| 5,399,915 | 3/1995 | Yahata ..................................... | 327/333 |
| 5,457,420 | 10/1995 | Asada ...................................... | 327/333 |
| 5,475,273 | 12/1995 | Paparo et al. ........................... | 327/545 |
| 5,517,153 | 5/1996 | Yin et al. .................................. | 327/408 |

Primary Examiner—My-Trang Nu Ton
Attorney, Agent, or Firm—Schwegman, Lundberg, Woessner & Kluth, P.A.

[57] ABSTRACT

A CMOS driver device including an output stage having a first PMOS transistor and an NMOS transistor serially connected between a first voltage and ground and having a second PMOS transistor and the NMOS transistor serially connected between the second voltage and ground. The driver device further includes control logic for mutually exclusively controlling the first PMOS transistor and the second PMOS transistor such that during a first time period an output of the output stage is driven to the first voltage and that during a second subsequent time period the output is driven to the second voltage. The control logic further includes logic for mutually exclusively controlling the first and second PMOS transistors and the NMOS transistor such that prior to enabling one of the first and second PMOS transistors, the NMOS transistor is disabled.

21 Claims, 7 Drawing Sheets

METHOD AND APPARATUS FOR A CHARGE CONSERVING DRIVER CIRCUIT FOR CAPACITIVE LOADS

This application is a continuation of U.S. Ser. No. 08/806,826 filed Feb. 26, 1997, now U.S. Pat. No. 5,760,621.

TECHNICAL FIELD OF THE INVENTION

The present invention relates generally to integrated circuits. In particular, the present invention relates to charge conserving, bi-parallel, low .to high voltage CMOS driver circuits for driving capacitive loads.

BACKGROUND OF THE INVENTION

Dynamic integrated circuit memories such as a dynamic random access memory (DRAM) traditionally store data as a charge on a memory cell capacitor. For example, a logical "one" is stored as positive charge on the capacitor and a logical "zero" is stored as negative charge on the capacitor. Because of the dense population of memory cells in an integrated circuit, the capacitance of each memory cell is small and the available charge is proportionally small. To read data from the memory cells, therefore, the charge must be sensed and amplified.

Typical memory circuits are designed to have pairs of data lines selectively coupled to the memory cells. The data line pairs are pre-charged to an equal potential between ground and the supply potential. When a memory cell is coupled to one of the data lines, a differential voltage is established between the data line pairs. An n-channel sense amplifier is used to detect the differential voltage and pull the low data line to ground. Likewise, a p-channel sense amplifier is used to detect the differential and drive the high data line to the supply voltage.

As stated, the DRAM memory cell is dynamic, and as such the data must be periodically refreshed by writing back the data to the memory cell. To extend the period between write backs, the initial charge stored on the memory cell should be provided using the maximum available potential voltage. To maintain a maximum charging potential during the memory cell refresh, the p-sense amplifiers may be coupled directly to the memory cell, or by using an isolation device, such as a transistor having a pumped gate voltage. Additional current must, therefore, be provided to source the pumped gate voltage.

Driver circuits for driving devices such as the isolation device which requires a pumped gate voltage have typically pulled all the charge necessary to drive the load from a pumped or elevated voltage source. Such drivers require an undesired level of current needed to drive the isolation devices entirely from the pumped voltage source.

In addition, conventional output driver circuits utilize complementary metal-oxide-semiconductor (CMOS) technology. A conventional CMOS output circuit includes a p-channel MOS (PMOS) transistor coupled between voltage and an output node, and an n-channel MOS AMOS) transistor coupled between the output node and ground. The CMOS design enables the PMOS transistor to be "on" while the NMOS transistor is "off", and vice versa, in response to a single input signal. When the PMOS transistor is "on" and the NMOS transistor is "off", the CMOS driver circuit outputs a voltage. Conversely, when the PMOS transistor is "off" and the NMOS transistor is "on", the output of the CMOS driver circuit is grounded.

A drawback inherent in the design of conventional CMOS output driver circuits is that during the low to high voltage swing at the input to the device, there exists a period of time when both the PMOS and NMOS transistors are "on." This dual activation condition causes a phenomenon known as "crossing current" which wastes power.

Therefore, there is a need in the art for a driver circuit that reduces the level of charge pulled from the pumped or elevated voltage source. In addition, the driver circuit should eliminate or substantially reduce crossing current in an effort to conserve power.

SUMMARY OF THE INVENTION

The above mentioned problems and others are addressed by the CMOS driver device of the present invention. The CMOS driver device includes a controllable CMOS output stage for providing a translated output signal based on one of a first and a second level input signal. The driver circuit further includes output stage control logic for receiving one of the first and the second level input signal. The output stage control logic includes first and second parallel voltage translators to generate control signals for controlling the controllable CMOS output stage and delay logic to control the first and second parallel voltage translators. The first and second parallel voltage translators are controlled such that a translated output signal representative of the one of the first and the second level input signal is derived in part from one of a first and second voltages during a first time period and in part from the other of the first and second voltages during a subsequent second time period.

In another embodiment, the delay logic includes input delay logic for receiving the one of the first and the second level input signal. The input delay logic activates the first voltage translator such that the translated output signal representative of the one of the first and the second level input signal is derived in part only from the first voltage during the first time period and subsequently deactivates the first voltage translator and activates the second voltage translator such that the translated output signal representative of the one of the first and the second level input signal is derived in part only from the second voltage during the subsequent second time period.

In another embodiment, the output stage control logic includes translator output logic. The translator logic receives translator output signals from each of the first and second voltage translators such that the controllable CMOS output stage is activated such that a transition between a first level output signal and a second level output signal is performed in a time staggered manner to minimize crossing current in the controllable CMOS output stage when the input signal transitions between first and second levels.

In another embodiment, the CMOS driver device includes an output stage having a first PMOS transistor and an NMOS transistor serially connected between a first voltage and ground and having a second PMOS transistor and the NMOS transistor serially connected between the second voltage and ground. The driver device further includes control logic for mutually exclusively controlling the first PMOS transistor and the second PMOS transistor such that during a first time period an output of the output stage is driven to the first voltage and that during a second subsequent time period the output is driven to the second voltage. The control logic further includes logic for mutually exclusively controlling the first and second PMOS transistors and the NMOS transistor such that prior to enabling one of the first and second PMOS transistors, the NMOS transistor is disabled.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present inventions. The following detailed description is, therefore, not to be taken in a limiting sense, and the scope of the present inventions is defined by the appended claims.

Each transistor described herein is either a P-channel or N-channel field-effect transistor (FET) having a gate, a first current node (drain) and a second current node (source). Since a FET is typically a symmetrical device, the true designation of "source" and "drain" is only possible once a voltage is impressed across the terminals. The designations of source and drain herein should be interpreted, therefore, in the broadest sense.

Figure 1:
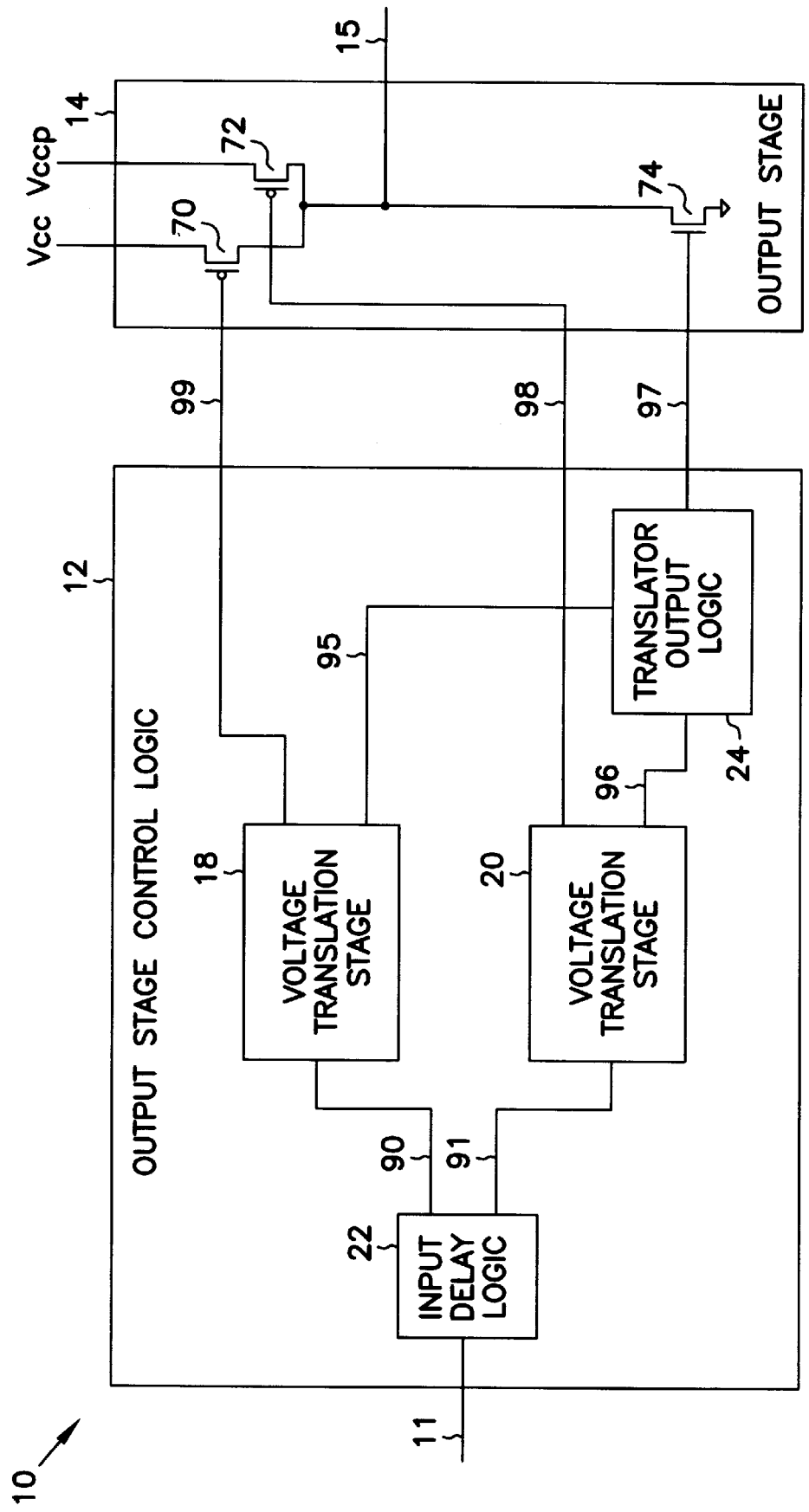
FIG. 1 is a block diagram of a low to high CMOS driver circuit in accordance with the present invention.

The low to high voltage CMOS driver circuit 10, in accordance with the present invention shall be generally described with reference to FIG. 1 and FIG. 3. The driver circuit 10 includes an output stage 14 for providing an output signal 15 under control of output stage control logic 12 and indicative of the input voltage applied on input 11. The output stage 14 includes an NMOS transistor 74 and a PMOS transistor 70 coupled between a first voltage level Vcc and another voltage level, such as ground. The output stage further includes another PMOS transistor 72 coupled with the NMOS transistor 74 between a second voltage source, such as a pumped voltage source Vccp, and ground. The CMOS output stage 14 provides an output signal 15 that swings between the first and second voltage levels and ground depending upon whether the NMOS transistor 74 and PMOS transistors 70, 72 are driven "on" or "off" by control signals 97–99.

Figure 2:
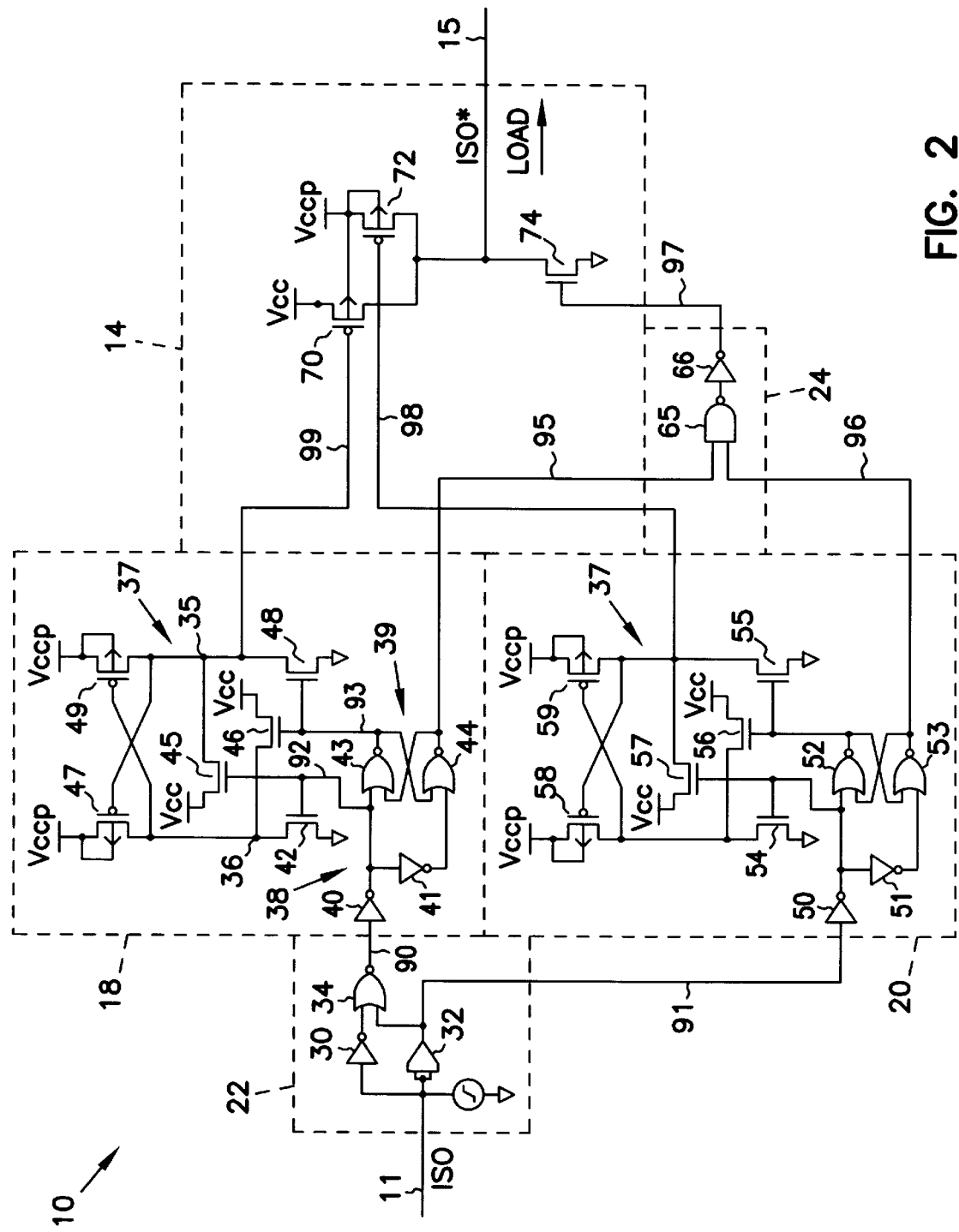
FIG. 2 is a schematic drawing of the low to high CMOS driver circuit shown in FIG. 1.

The CMOS driver circuit 10 is designed to drive a capacitive load. One example capacitive load is an isolation device used in memory arrays driven by an elevated voltage such as Vccp. Such a driver circuit may also be beneficial for driving a global row select line in a semiconductor memory array or other devices being driven at a pumped or elevated voltage. CMOS driver circuit 10 translates a low voltage input signal 11, such as an isolation device signal ISO (FIG. 2), which swings between Vcc (e.g., 2.5 volts) and ground to a high voltage output signal 15, such as isolation device signal ISO* (FIG. 2), which swings between Vccp (e.g., 4.0 volts) and ground. The notation ISO* denotes a voltage translated version of the input signal ISO. The notation "Vccp" is customary to denote a higher voltage or pumped-up level above Vcc.

The output stage control logic 12 of the CMOS driver circuit 10 includes means for controlling the output stage 14 via control signals 97–99 as a function of the received input signal 11 indicative of a desired output signal 15. The output stage control logic 12 generates independent control signals 97–99 which are used to selectively enable and disable the transistors in the CMOS output stage 14. That is, independent control signal 97 is coupled to turn "on" and "off" the NMOS transistor, independent control signal 98 is coupled to turn "on" and "off" the PMOS transistor 72 connected to Vccp, and independent control signal 99 is coupled to turn "on" and "off" the PMOS transistor 70 connected to Vcc. Output stage control logic 12 provides control of output stage 14 such that PMOS transistors 70, 72 are operated in a mutually exclusive fashion; therefore, only one of these devices is "on" at any given time.

The output stage control logic 12 includes a pair of voltage translator stages 18 and 20, input delay logic 22, and translator output logic 24. The first voltage translator 18 drives the PMOS transistor 70 and the second voltage translator 20 drives PMOS transistor 72. Both the first voltage translator 18 and the second voltage translator 20 provide translator output control signals 95, 96 to translator output logic 24 to generate control signal 97 for enabling and disabling NMOS transistor 74.

When input signal 11 transitions from low to high, the input delay logic applies an internal signal 90 representative of the low to high transition to the first voltage translation stage 18, but not the second voltage translation stage 20. The first translator stage 18 generates controls signals 95 and 99 for disabling NMOS transistor 74 via translator output logic 24 and enabling PMOS transistor 70, which drives the output signal 15 to Vcc. The input signal 11 is delayed by input delay logic 22 prior to an internal signal 91 representative of the low to high transition being applied to the second voltage translation stage 20 and internal input signal 90 is altered such that the first voltage translation stage turns off PMOS transistor 70. The second voltage translation stage 20 then generates control signals 96 and 98 for turning on PMOS transistor 72 and maintaining the disabled state of NMOS transistor 74. The output signal 15 is then driven to Vccp. Therefore, the output stage 14 is controlled such that the PMOS transistors 70, 72 are operated in a mutually exclusive fashion and as shown in FIG. 3, the output signal 15 is brought to about Vcc via PMOS transistor 70 and then to about Vccp via PMOS transistor 72. Control signals 97–99 are also generated such that when the input signal is transitioned low or to ground, the output signal 15 also is brought to ground.

Figure 4:
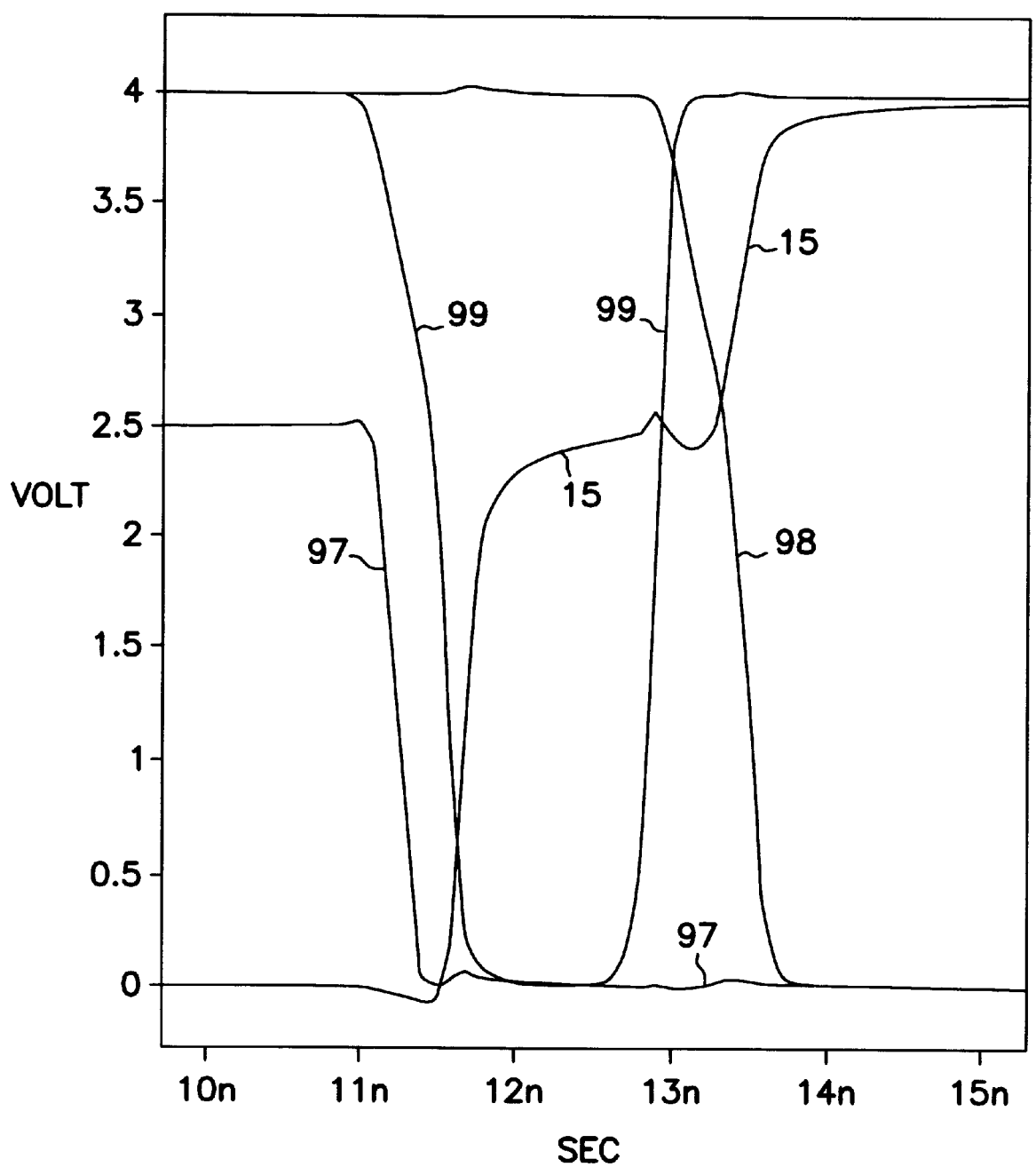
FIG. 4 is a diagram showing the signals shown in FIG. 3 superimposed upon one another during a low to high transition of the input signal of the driver circuit of FIG. 2.

Further, the output stage control logic 12 generates control signals 97–99 such that the NMOS transistor 74 is turned "off" before turning "on" the disabled PMOS transistor 70. In this manner, the output stage control logic 12 independently activates the NMOS transistor 74 and PMOS transistors 70, 72 in a time-staggered manner to minimize crossing current in the CMOS output stage during transitions of the input signal 11. This saves power which would otherwise be lost due to crossing current. This independent activation is best shown in FIG. 4 wherein the control signal 97 transitions low prior to control signal 99 and in FIG. 5 wherein the control signal 98 transitions high prior to the control signal 97.

The present invention shall now be described in further detail with reference to FIGS. 2–6. The low to high voltage CMOS driver 10 in accordance with the present invention, includes output stage 14, input delay logic 22, parallel voltage translations stages 18, 20, and translator output logic 24. The CMOS output stage 14 includes the NMOS transistor 74 which has a source-to-drain path coupled between driver output 15 and ground or a first voltage level. The CMOS output stage 14 also has a first PMOS transistor 70 and a second PMOS transistor 72. The firs PMOS transistor 70 has a source-to-drain path coupled between a second voltage level, or Vcc, and driver output 15 and second PMOS transistor 72 has a source-to-drain path coupled between a third voltage level, or Vccp, and driver output 15. The third voltage level is a pumped or elevated voltage level with respect to the Vcc and may be generated therefrom utilizing additional circuitry as is known to one skilled in the art.

The PMOS transistors 70, 72 and the NMOS transistor 74 in the CMOS output stage 14 are controlled by three independent control signals 97–99. When the PMOS transistor 70 is "on" and the NMOS transistor 74 is "off," the output signal 15 is at Vcc. When PMOS transistor 72 is "on" and the NMOS transistor 74 is "off," the output signal 15 is at Vccp. Further, when the PMOS transistors 70, 72 are "off" and the NMOS transistor 74 is "on," the output signal 15 is at ground. In this embodiment, the input signal 11 is ISO and the output signal 15 is ISO* for driving an isolation device as generally described previously. The specification of such input and output is only for illustrative purposes only and is not to be taken as limiting the claims of the present invention in any manner. Various inputs and outputs are contemplated in accordance with the present invention, such as the global row select previously mentioned.

Input delay logic 22 includes delay element 32, inverter 30 and NOR gate 34. Both the delay element 32 and the inverter 30 are coupled to receive the input signal 11. The inverter 30 is connected to provide its output to one of the inputs of the NOR gate 34 and the other input of the NOR gate 34 is coupled to the output of the delay element 32. The output 90 of the NOR gate 34 is applied to the first voltage translation stage 18 and the output 91 of the delay element 32 is applied to the second voltage translation stage 20.

The components of input delay logic 22 including delay element 32 are selected such that when the input signal 11 transitions high, the transitioned input signal or output 90 representative of the transitioned input is provided to the first voltage translation stage 18. The delay element 32 delays the application of the transitioned input signal or output 91 from being applied to the second voltage translation stage 20 such that output signal 15 is driven to Vcc during a time period substantially equal to the delay period. Then the delayed input signal 91 is applied to the NOR gate 34 to provide an output 90 that results in the gate of PMOS transistor 70 being driven to Vccp and, therefore "off." The delayed signal 91 is also applied to the second voltage translation stage 20 such that PMOS transistor 72 is turned "on" with the output signal 15 being driven to Vccp. Therefore, the input delay logic 22 controls the first and second voltage translation stages 18, 20 in a mutually exclusive fashion such that PMOS transistors 70, 72 are driven independently. In one particular embodiment, such mutually exclusive operation allows for about half the charge required for the load on output 15 to come from Vcc and about half from Vccp. This delayed operation is shown in the diagrams of FIGS. 3–6 as described further below.

The output signals 90, 91 of the input delay logic 22 are each applied to one of the first and second voltage translation stages 18, 20. The first voltage translation stage 18 which receives the output 90 includes: inverters 40, 41; a NOR latch including NOR gates 43, 44; and transistors 42, 45–49. The second voltage translation stage 20 is like that of the first and includes: inverters 50, 51; a NOR latch including NOR gates 52, 53; and transistors 54–59. Each operate in the same manner as described below and each generates two control signals. The first voltage translation stage 18 provides control signals 95, 99 and the second voltage translation stage 20 provides control signals 96, 98. The first and second voltage translation stages 18 and 20 in conjunction with the translator output logic 24 provide for the elimination of or minimization of crossing current in the output stage 14 as described below.

The translator output logic 24 of the output stage control logic 12 includes a NAND gate 65 and an inverter 66. The NAND gate 65 receives the translator output signals 95, 96 from the first and second voltage translation stages and the inverter is coupled to the output of the NAND gate 65 and to the gate of NMOS transistor 74 for control thereof.

The inverters 40, 41 and the NOR latch 39 of the first voltage translation stage 18 form an input stage 38 thereof for receiving the output 90 of input delay logic 22. Input stage 38 generates three independent control signals 92, 93, and 95 based upon the output signal 90 of the input delay logic 22. The control signal 95 is provided to one of the inputs of NAND gate 65 of the translator output logic 24 with the translator output signal 96 from the second translation stage 20. The output of the NAND gate 65 is then inverted and applied as control signal 97 to NMOS transistor 74 to control the gate thereof, and thereby activate or deactivate the NMOS transistor 74. The other two signals 92, 93 are input to voltage translation portion 37 of the first voltage translation stage 18, as described below in more detail.

Input stage 38 includes latch 39 which generates the control signals 93, 95. Latch 39 is preferably configured as a cross-coupled NOR gate latch having NOR gates 43 and 44. Input stage 38 also includes the inverter 40 to initially invert signal 90 and the other inverter 41 is coupled between the first inverter and the input of NOR gate 44.

The voltage translation portion 37 of the first voltage translation stage 18 is coupled between input stage 38 and output stage 14. The voltage translation portion 37 receives the internal control signals 92 and 93 from the input stage 38, and uses these control signals 92, 93 to generate an independent, higher voltage activation control signal 99. This control signal 99 is utilized to control the PMOS transistor 70 of output stage 14. Due to the inherent delay time that it takes signal 90 to propagate through input stage 38 and voltage translation portion 37, the control signal 99 is time staggered from control signal 95. As a result, control signal 97 generated as a function of control signal 95 and control signal 99 independently turn "on" and "off" the PMOS transistor 70 and NMOS transistor 74. This independent control minimizes or eliminates crossing current in the CMOS output stage 14.

Voltage translation portion 37 includes a pair of cross-coupled PMOS transistors 47 and 49. The PMOS transistor 47 has a source-to-rain path coupled between Vccp and a first node 36. The PMOS transistor 49 has a source-to-drain path coupled between Vccp and an output node 35 which is coupled to the gate of PMOS transistor 70 in output stage 14. The gate of the PMOS transistor 49 is coupled to node 36 and the gate of the PMOS transistor 47 is coupled to output node 35 to form the cross-coupled PMOS transistor structure.

Voltage translation portion 37 further includes a first NMOS control transistor 42 which has a source-to-drain path coupled between node 36 and ground. The gate of control transistor 42 is coupled to receive the internal control signal 92 from input stage 38. A second NMOS control transistor 48 has a source-to-drain path coupled between output node 35 and ground. The gate of this second control transistor 48 is coupled to receive the internal control signal 93 from input stage 38.

Control transistors 42 and 48 control the pair of cross-coupled PMOS transistors 47 and 49 to alternately output at output node 35 a control signal 99 that swings between Vccp and ground. Internal signals 92 and 93 selectively turn "on" and "off" control transistors 42 and 48 in an alternating, out-of-phase fashion. When control transistor 42 is "on" and control transistor 48 is "off," first node 36 is grounded, thereby turning "on" PMOS transistor 49. The Vccp voltage is thus placed at output node 35, keeping PMOS transistor 47 in an "off" state. When control transistor 48 is "on" and control transistor 42 is "off", output node 35 is grounded and PMOS transistor 47 is turned "on. " The other PMOS transistor 49 is then turned "off" and the voltage translation portion 37 outputs a ground level voltage at output node 35 as control signal 99.

According to another aspect of the driver circuit 10, voltage translation portion 37 of the first voltage translation stage 18 includes NMOS precharge transistors 45 and 46. The first NMOS precharge transistor 46 has a gate coupled to the gate of the second NMOS control transistor 48 and to the input stage 38. Precharge transistor 46 is selectively activated by the internal control signal 93. Precharge transistor 46 has a source-to-drain path coupled between Vcc and the first node 36. Similarly, a second NMOS precharge transistor 45 has a gate coupled to the gate of the first NMOS control transistor 42 and to input stage 38. Precharge transistor 45 is selectively activated by the internal control signal 92. Precharge transistor 45 has a source-to-drain path coupled between Vcc and output node 35.

The precharge transistors 45 and 46 raise respective nodes 35 and 36 toward Vcc before the cross-coupled PMOS transistors 47 and 49 turn "on" to further increase the voltage levels at those nodes to Vccp. For example, when internal control signal 93 goes high to turn "on" control transistor 48, it simultaneously turns "on" precharge transistor 46. As a result, first node 36 begins to rise from ground towards Vcc-Vt, wherein Vt is the threshold voltage of the transistor. Within a minor time delay, PMOS transistor 47 is turned "on" to further raise the voltage level at first node 36 to Vccp. The precharge transistor 45 does essentially the same function for output node 35. These precharge transistors help reduce Vccp current through the voltage translation portion 37 during a transition.

Precharge transistors 45 and 46 form one implementation of a precharge means for precharging the pair of cross-coupled transistors 47 and 49 to facilitate transition during toggle between the two output states. Other gate arrangements besides the single NMOS transistors shown can also be used to precharge the respective nodes. Example alternate embodiments might include PMOS transistors, pass circuits having a combination PMOS and NMOS transistors, or other equivalent structures.

The second voltage translation stage 20 contains substantially the same elements as the first voltage translation stage and operates in substantially the same manner. Therefore, a detailed description with regard to the second voltage translation stage 20 shall not be provided. In general, the second voltage translation stage 20 provides control signal 98 for control of PMOS transistor 72 of the output stage 14. It further also provides translator output signal 96 to translator output logic 24 with the translator output signal 95 from the first voltage translation stage for control of NMOS transistor 74 in a time staggered manner with respect to activation and deactivation of PMOS transistors 70 and 72 via NAND gate 65 and inverter 66.

Figure 7:
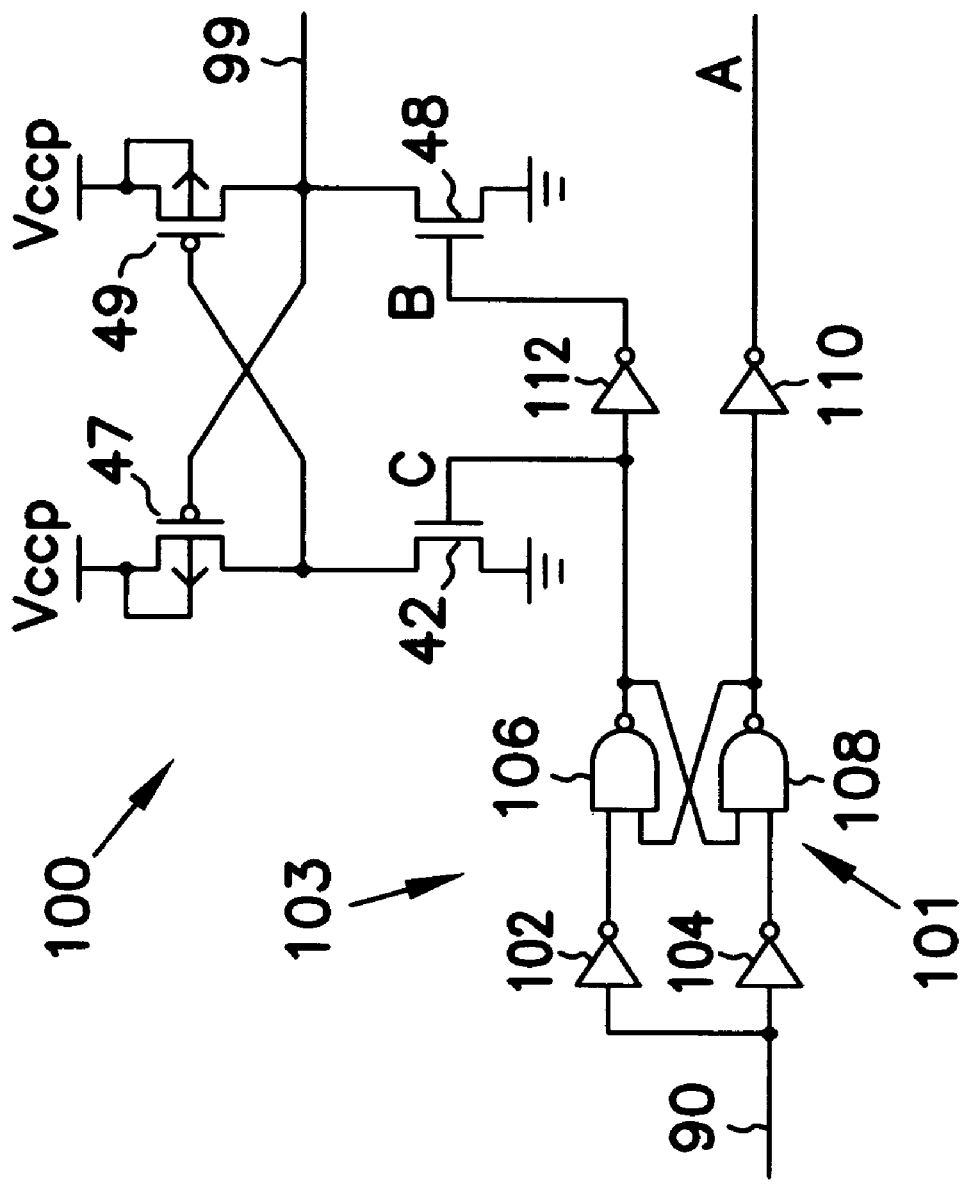
FIG. 7 is a schematic diagram for an alternate embodiment of the voltage translator of the driver circuit shown in FIG. 2.

FIG. 7 illustrates an alternate embodiment for the voltage translation stages 18 and 20 of the driver circuit 10 in accordance with the present invention. The alternate voltage translation stage 100 differs from previously described voltage translation stages of FIG. 2 in that input stage 103 includes a crosscoupled NAND gate latch 101 having a first NAND gate 106 and a second NAND gate 108. Input stage 103 further includes inverters 102 and 104 on the front end of NAND gate latch 101, and inverters 112 and 110 on the back end of the NAND gate latch 101. According to this construction, input stage 103 outputs three control signals A, B, and C. This embodiment also reduces crossing current in both the voltage translation stage 100 and output stage 14.

Figure 3:
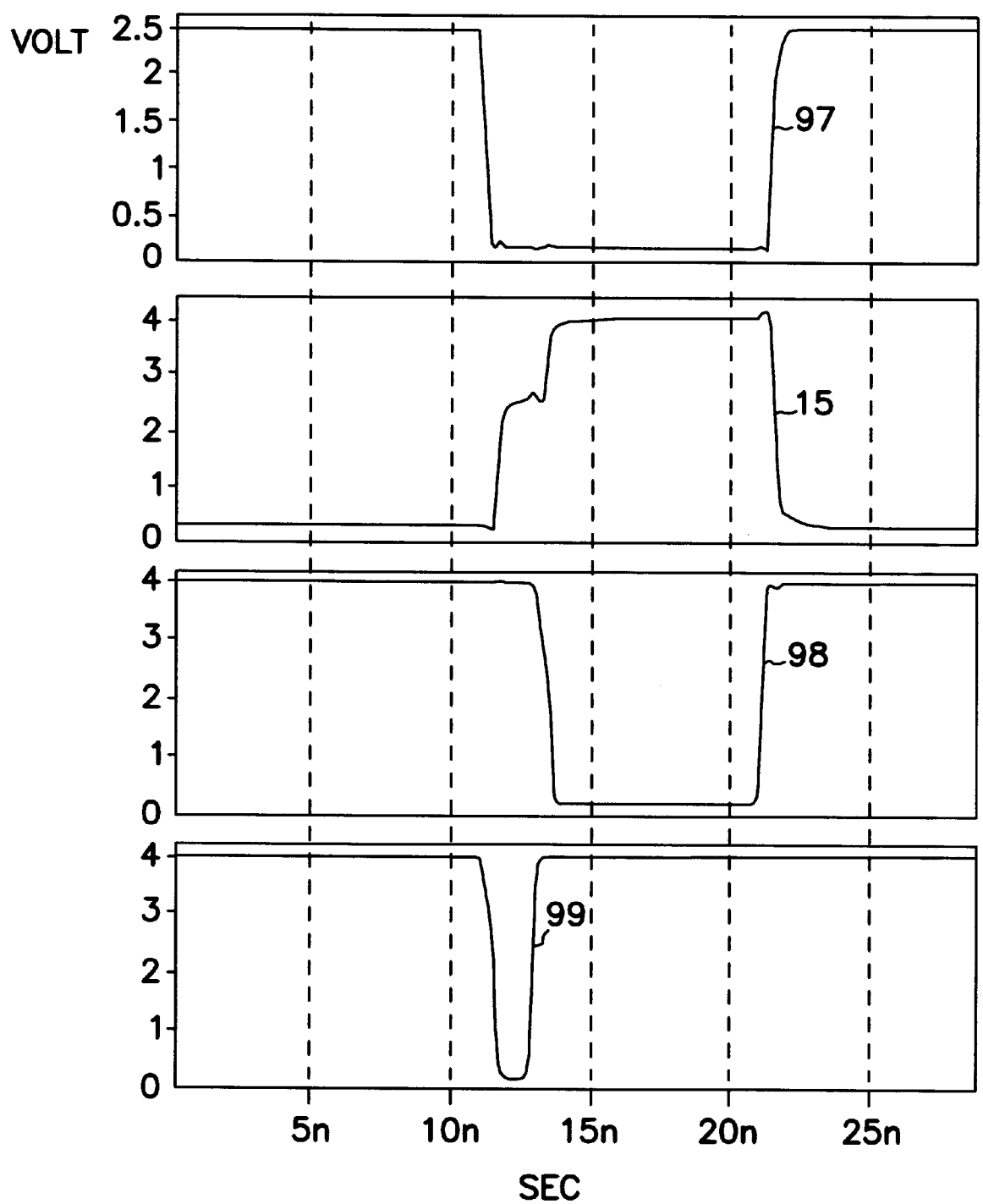
FIG. 3 is a diagram showing the output signal provided at the output of the output stage of the driver circuit of FIG. 2 and various control signals for control of the output stage of the driver circuit of FIG. 2.
Figure 6:
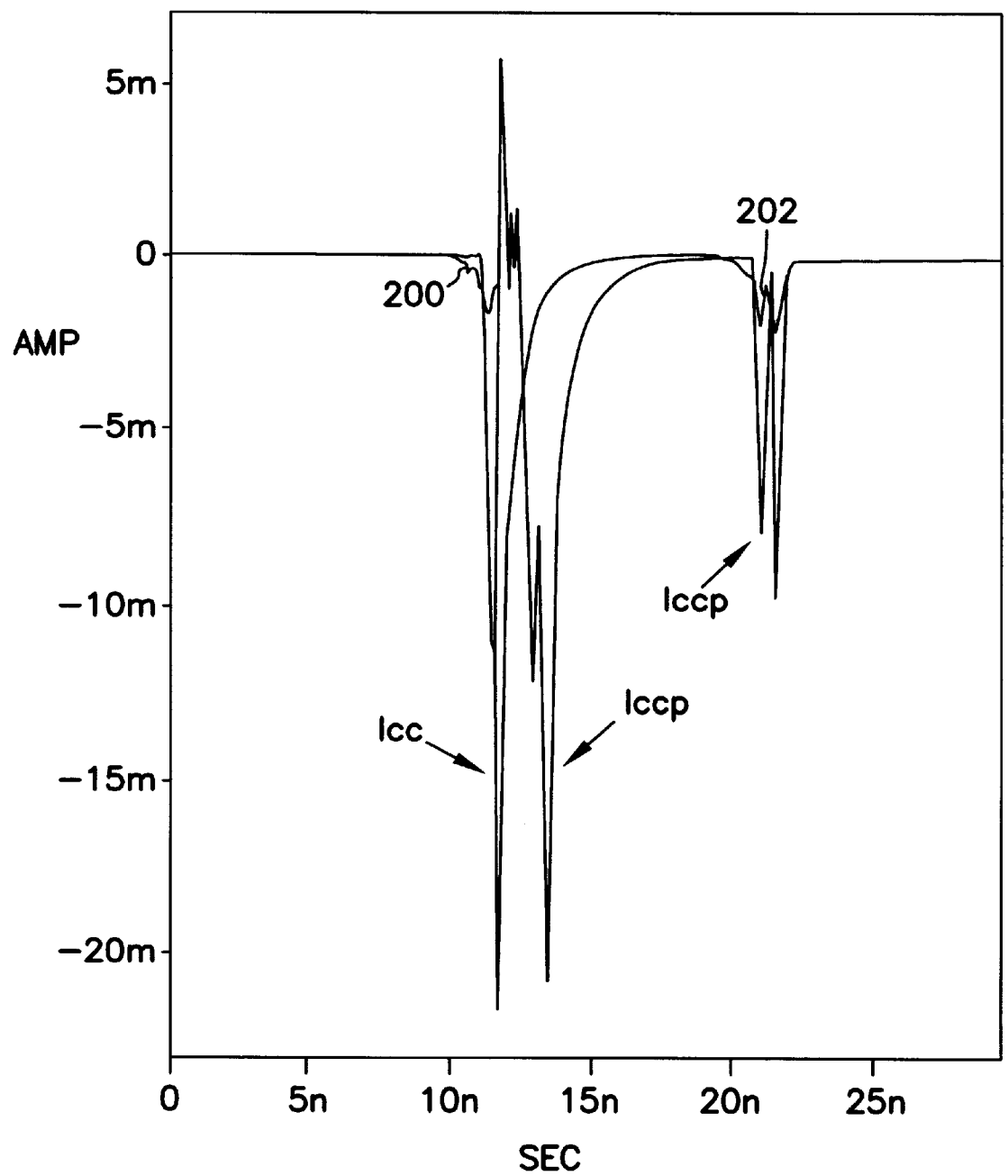
FIG. 6 is a diagram showing the charging current for the diagram shown in FIG. 3.

FIG. 3 illustrates a separated timing diagram of the independent control signals 97–99 generated by the output stage control logic 12 used to activate respective transistors 74, 72, and 70 of output stage 14. Also illustrated is the output signal 15. The timing diagram proceeds through a first transition from low to high at the input 11 and then a second transition back to low. The transitions of input signal 11 respectively provide a first transition of output signal 15 from ground to Vccp (e.g., 4.0 volts) and a second transition from Vccp back to ground. During the first transition, independent control signal 97 goes low to first turn "off" NMOS transistor 74. Subsequently, the second independent control signal 99 goes low to turn "on" PMOS transistor 70. Due to the time-staggered nature of these two signals because of the delay through the input stages and the voltage translation portions of the first and second voltage translation stages 18 and 20 as opposed to the control signals 95 and 96 being applied to translator output logic 24 for control of NMOS transistor 74, output stage 14 experiences little or no crossing current during the transition. Accordingly, the operation conserves power by avoiding the crossing current. The composite diagram of the first transition in FIG. 4 shows the time staggered nature between control signal 97 transitioning low and control signal 99 transitioning low. As a result, minimal crossing current occurs as shown in FIG. 6 at reference number 200.

During the time control signal 99 is low and PMOS transistor 70 is enabled, the output signal 15 is being driven to Vcc. After the input signal 11 has proceeded through delay element 32, the control signal 99 from the first voltage translation stage 18 is forced high and therefore PMOS transistor 70 is disabled. Subsequently, the control signal 98 transitions low and PMOS transistor 72 is enabled driving the output signal 15 to Vccp. As a result of first driving the output with Vcc and then driving the output with Vccp, the charge removed from Vccp is reduced. This is particularly important since Vccp is a pumped voltage supply. The current drawn during the output being driven by Vcc and then Vccp is shown in FIG. 6. Icc is the current drawn during the output being driven to Vcc and Iccp is the current drawn during the output being driven to Vccp.

Figure 5:
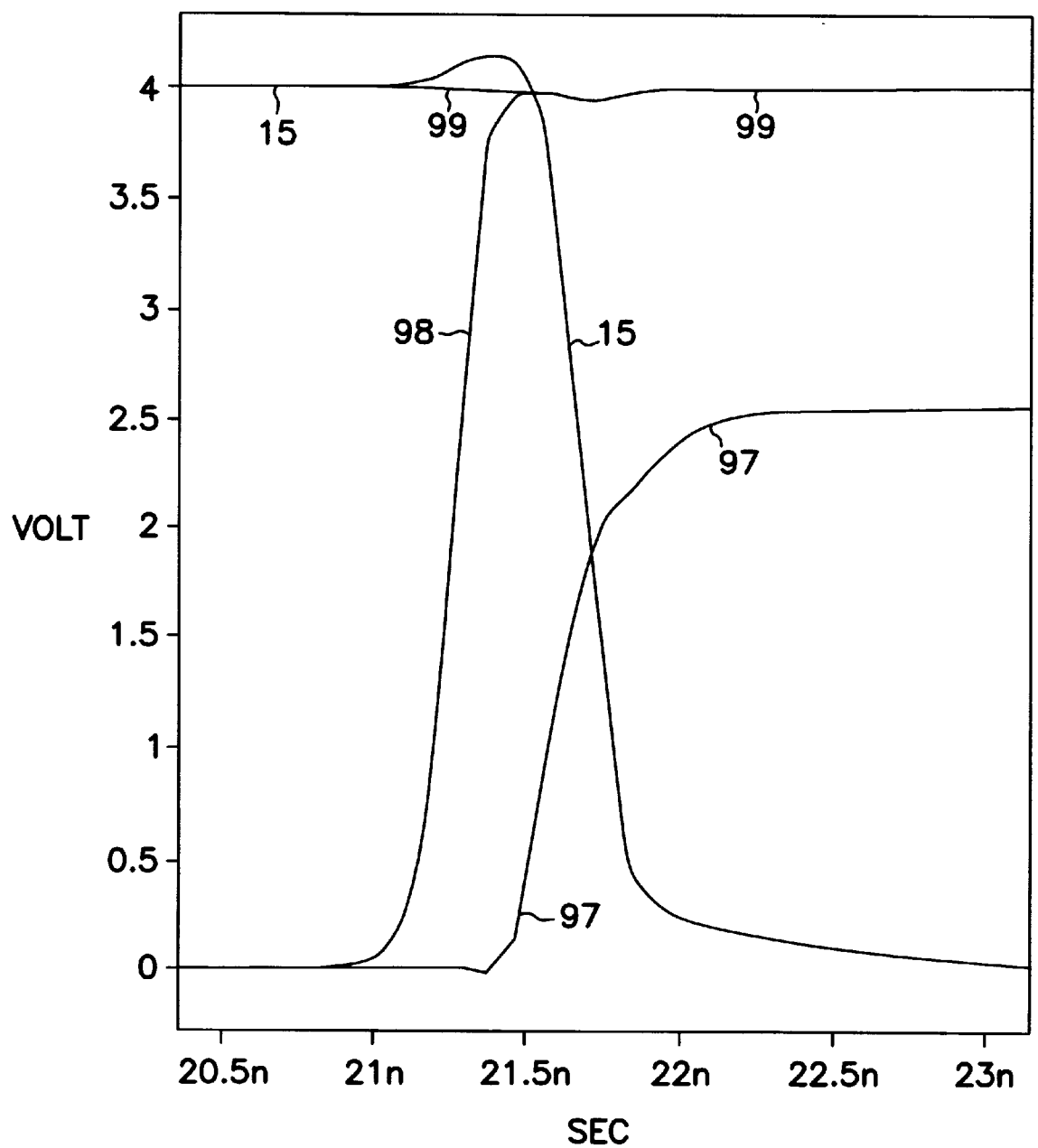
FIG. 5 is a diagram showing the signals shown in FIG. 3 superimposed upon one another during a high to low transition of the input signal of the driver circuit of FIG. 2.

During the second transition when input signal 11 transitions to ground, independent control signal 99 does not change states. However, control signal 98 returns high to first turn "off" PMOS transistor 72. Subsequently, independent control signal 97 returns high to thereby turn "on" NMOS transistor 74. Again, the time-staggered nature of these two independent control signals prevents crossing current during the transition. This time-staggered effect is shown in the composite diagram of FIG. 5 showing the second transition wherein control signal 98 transitions high prior to control signal 97. The output signal 15 then is brought to ground. FIG. 6 shows at reference number 202 the crossing current for the second transition.

As described above, FIG. 6 shows the load current spikes measured at output stage 14 which occur during the first and second transitions shown in FIGS. 3–5. These load current spikes represent the current flowing through PMOS transistor 70 and 72 and NMOS transistor 74 into a capacitive load. If no crossing current existed, current spikes 200 and 202 would be eliminated.

It is further noted that the CMOS driver circuit 10 minimizes crossing current in the voltage translation stages 18 and 20. Accordingly, the circuit effectively eliminates or substantially reduces crossing current in both the output stage 14 and the voltage translation stages 18 and 20.

It is to be understood, however, that even though numerous characteristics of the present invention have been set forth in the foregoing description, together with details of the structure and function of the invention, the disclosure is illustrative and changes in matters of order, shape, size, and arrangement of the parts, and various properties of the operation may be made within the principles of the invention and to the full extent indicated by the broad general meaning of the terms in which the appended claims are expressed.

What is claimed is:

1. A method of translating an internal voltage to an external voltage, comprising:
   receiving an internal signal having a first voltage swing;
   producing an output signal having a second voltage swing in response to the internal signal, comprising:
      detecting a transition of the internal signal from a first level to a second voltage level;
      producing a delayed signal response to the transition of the internal signal;
      transitioning the output signal from a first voltage level to a second voltage level in response to the transition of the internal signal; and
      transitioning the output signal from the second voltage level to a third voltage level in response to the delayed signal.

2. A voltage translation circuit, comprising:
   a first switch connected to pull an output signal to a first voltage level;
   a second switch connected to pull the output signal to a second voltage level;
   a third switch connected to pull the output signal to a ground potential;
   a delay circuit connected to receive an internal signal and to produce a delayed internal signal in response thereto;
   a first translator circuit connected to operate the first switch in response to the internal signal; and
   a second translator circuit connected to operate the third switch in response to the delayed internal signal.

3. The circuit according to claim 2, wherein the output signal has a voltage swing greater than a voltage swing of the internal signal.

4. A voltage translation circuit, comprising:
   a first switch connected to pull an output signal to a first voltage level;
   a second switch connected to pull the output signal to a second voltage level;
   a third switch connected to pull the output signal to a ground potential;
   a delay circuit connected to receive an internal signal and to produce a delayed internal signal in response thereto;
   a first translator circuit connected to operate the first switch and the third switch in response to the internal signal; and
   a second translator circuit connected to operate the second switch and the third switch in response to the delayed internal signal.

5. The circuit according to claim 4, wherein the output signal has a voltage swing greater than a voltage swing of the internal signal.

6. The circuit according to claim 4, wherein the first switch and the second switch are PMOS devices, and wherein the third switch is an NMOS device.

7. The circuit according to claim 4, wherein the first translator has a precharging means to facilitate operating the first switch.

8. The circuit according to claim 4, wherein the second translator has a precharging means to facilitate operating the second switch.

9. A method for operating a CMOS driver circuit, comprising:
   transitioning an input signal from a low level to a high level;
   creating a first internal signal representative of the input signal;
   applying the first internal signal to a first voltage translation stage;
   generating a first control signal in the first voltage translation stage;
   creating a second internal signal;
   applying the second internal signal to a second voltage translation stage;
   generating a second control signal in the second voltage translation stage; and
   operatively controlling an output stage with the first voltage translation stage and the second voltage translation stage such that a selectable voltage level out of the output stage is derived in part from the first control signal during a first time period and another selectable voltage level out of the output stage is derived in part from the second control signal during a subsequent second time period.

10. The method of claim 9 further comprising precharging a voltage level of the first voltage translation stage to facilitate transitioning from one of the selectable voltage levels to another of the selectable voltage levels.

11. A CMOS driver device, comprising:
   a controllable CMOS output stage for providing a translated output signal having selectable voltage levels in response to an input signal; and
   output stage control logic connected for controlling the controllable CMOS output stage and connected for receiving the input signal, the output stage control logic including:
      a first voltage translator to generate a first control signal for controlling the controllable CMOS output stage;

a second voltage translator to generate a second control signal for controlling the controllable CMOS output stage;

input delay logic connected to receive the input signal and operable in response to a transition on the input signal to control the first and second voltage translators such that one of the selectable voltage levels of the translated output signal is derived in part from the first control signal during a first time period and another of the selectable voltage levels of the translated output signal is derived in part from the second control signal during a subsequent second time period; and a precharging means for the first voltage translator to facilitate transitioning from one of the selectable voltage levels to another of the selectable voltage levels.

12. A CMOS driver device, comprising:

a controllable CMOS output stage for providing a translated output signal having selectable voltage levels in response to an input signal; and output stage control logic connected for controlling the controllable CMOS output stage and connected for receiving the input signal, the output stage control logic including:

a first voltage translator with a first input stage to generate a first control signal for controlling the controllable CMOS output stage;

a second voltage translator with a second input stage to generate a second control signal for controlling the controllable CMOS output stage; and input delay logic connected to receive the input signal and operable in response to a transition on the input signal to control the first and second voltage translators such that one of the selectable voltage levels of the translated output signal is derived in part from the first control signal during a first time period and another of the selectable voltage levels of the translated output signal is derived in part from the second control signal during a subsequent second time period.

13. The device according to claim 12, wherein the first input stage of the first voltage translator includes a latch wherein the latch is a cross-coupled NOR gate latch or a cross-coupled NAND gate latch.

14. The device according to claim 12, wherein the second input stage of the second voltage translator includes a latch wherein the latch is a cross-coupled NOR gate latch or a cross-coupled NAND gate latch.

15. A semiconductor device, comprising:

a plurality of memory cells;

a plurality of sense amplifiers for sensing memory cell charges;

a plurality of isolation devices for isolating the sense amplifiers from the memory cells;

a plurality of CMOS driver devices for driving the isolation devices, comprising:

a controllable CMOS output stage for providing a voltage translated output signal, the controllable CMOS output stage including:

a first PMOS transistor and an NMOS transistor serially connected between a first voltage and a ground;

a second PMOS transistor and the NMOS transistor serially connected between a second voltage and the ground;

input delay logic for receiving an input signal indicative of either a low voltage level or a high voltage level, the input delay logic for providing a first internal input signal and a delayed second internal input signal;

a first voltage translator for receiving the first internal input signal, for generating a first control output for driving the first PMOS transistor and for generating a second control output;

a second voltage translator for receiving the delayed second internal input signal, for generating a third control output for driving the second PMOS transistor and for generating a fourth control output;

translator output logic for receiving the second and fourth control outputs and generating an NMOS control output for driving the NMOS transistor; and wherein the first and third control outputs and the NMOS control output are coupled to the first and second PMOS transistors and the NMOS transistor for turning the first and second PMOS transistors and the NMOS transistors "off" and "on" such that a voltage translated output signal representative of a high voltage level input signal is derived in part from the first voltage during a first time period and in part from the second voltage during a subsequent second time period.

16. A computer system comprising:

a central processing unit; and a memory device, comprising:

a plurality of memory cells;

a plurality of sense amplifiers for sensing memory cell charges;

a plurality of isolation devices for isolating the sense amplifiers from the memory cells;

a plurality of CMOS driver devices for driving the isolation devices, comprising:

a controllable CMOS output stage for providing a voltage translated output signal, the controllable CMOS output stage including:

a first PMOS transistor and an NMOS transistor serially connected between a first voltage and a ground;

a second PMOS transistor and the NMOS transistor serially connected between a second voltage and the ground;

input delay logic for receiving an input signal indicative of either a low voltage level or a high voltage level, the input delay logic for providing a first internal input signal and a delayed second internal input signal;

a first voltage translator for receiving the first internal input signal, for generating a first control output for driving the first PMOS transistor and for generating a second control output;

a second voltage translator for receiving the delayed second internal input signal, for generating a third control output for driving the second PMOS transistor and for generating a fourth control output;

translator output logic for receiving the second and fourth control outputs and generating an NMOS control output for driving the NMOS transistor; and wherein the first and third control outputs and the NMOS control output are coupled to the first and second PMOS transistors and the NMOS transistor for turning the first and second PMOS transistors and the NMOS transistors "off" and "on" such that a voltage translated output signal representative of a high voltage level input signal is derived in part from the first voltage during a first time period and in part from the second voltage during a subsequent second time period.

17. An integrated circuit, comprising:

an input delay logic circuit coupled to an input line;

a first voltage translator circuit coupled to the input delay logic circuit;

a second voltage translator circuit coupled to the input delay logic circuit;

a translator output logic circuit coupled to the first voltage translator circuit and the second voltage translator circuit;

a first PMOS transistor, wherein a gate of the first PMOS transistor is coupled to the first voltage translator circuit, wherein a source of the first PMOS transistor is coupled to a first upper voltage source and wherein a drain of the first PMOS transistor is coupled to an output line;

a second PMOS transistor, wherein a gate of the second PMOS transistor is coupled to the second voltage translator circuit, wherein a source of the second PMOS transistor is coupled to a second upper voltage source and wherein a drain of the second PMOS transistor is coupled to the output line; and an NMOS transistor, wherein a gate of the NMOS transistor is coupled to the translator output logic circuit, wherein a source of the NMOS transistor is coupled to a lower voltage source and wherein a drain of the NMOS transistor is coupled to the output line.

18. The integrated circuit of claim 17, wherein the input delay logic circuit activates the first voltage translator circuit such that an output signal transmitted to the output line is derived from the first upper voltage source during a first time period and subsequently deactivates the first voltage translator circuit and activates the second voltage translator circuit such that the output signal transmitted to the output line is derived from the second upper voltage source during a subsequent time period.

19. A computer system comprising:

a processing unit; and a memory device coupled to the processing unit, the memory device including:

an input delay logic circuit coupled to an input line;

a first voltage translator circuit coupled to the input delay logic circuit;

a second voltage translator circuit coupled to the input delay logic circuit;

a translator output logic circuit coupled to the first voltage translator circuit and the second voltage translator circuit;

a first PMOS transistor, wherein a gate of the first PMOS transistor is coupled to the first voltage translator circuit, wherein a source of the first PMOS transistor is coupled to a first upper voltage source and wherein a drain of the first PMOS transistor is coupled to an output line;

a second PMOS transistor, wherein a gate of the second PMOS transistor is coupled to the second voltage translator circuit, wherein a source of the second PMOS transistor is coupled to a second upper voltage source and wherein a drain of the second PMOS transistor is coupled to the output line; and an NMOS transistor, wherein a gate of the NMOS transistor is coupled to the translator output logic circuit, wherein a source of the NMOS transistor is coupled to a lower voltage source and wherein a drain of the NMOS transistor is coupled to the output line.

20. The computer system of claim 19, wherein the input delay logic circuit activates the first voltage translator circuit such that an output signal transmitted to the output line is derived from the first upper voltage source during a first time period and subsequently deactivates the first voltage translator circuit and activates the second voltage translator circuit such that the output signal transmitted to the output line is derived from the second upper voltage source during a subsequent time period.

21. A voltage translation circuit comprising:

a control circuit coupled to receive an input signal; and an output circuit coupled to the control circuit and coupled to transmit an output signal, wherein the output signal has selectable voltage levels in response to the input signal and wherein the output signal transmitted is derived in part only from one of the selectable voltage levels during a first time period and subsequently the output signal transmitted is derived in part only from another one of the selectable voltage levels during a second time period wherein the control circuit includes:

a first voltage translator such that the first voltage translator circuit is activated and transmits a first control signal to the output circuit to select the selectable voltage level during the first time period; and a second voltage translator circuit such that the second voltage translator circuit is activated and transmits a second control signal to the output circuit to select the selectable voltage level during the second time period.

* * * * *

UNITED STATES PATENT AND TRADEMARK OFFICE
CERTIFICATE OF CORRECTION

PATENT NO.: 6,057,718
DATED: May 2, 2000
INVENTOR(S) : Keeth

It is certified that error appears in the above-identified patent and that said Letters Patent is hereby corrected as shown below:

In column 1, line 12, delete "low .to" and insert --low to--, therefor.

In column 1, line 57, delete "MOS AMOS)" and insert --MOS (NMOS)--, therefor.

In column 5, line 13, delete "firs" and insert --first--, therefor.

In column 8, line 19, delete "crosscoupled" and insert --cross-coupled--, therefor.

Signed and Sealed this

Eighth Day of May, 2001

*Attest:*

NICHOLAS P. GODICI

*Attesting Officer*       *Acting Director of the United States Patent and Trademark Office*